United States Patent
Mimura

(10) Patent No.: US 10,325,788 B2
(45) Date of Patent: Jun. 18, 2019

(54) TEMPERATURE CONTROLLER OF SEMICONDUCTOR WAFER AND TEMPERATURE CONTROL METHOD OF SEMICONDUCTOR WAFER

(71) Applicant: Kelk Ltd., Hiratsuka-shi, Kanagawa (JP)

(72) Inventor: Kazuhiro Mimura, Hiratsuka (JP)

(73) Assignee: KELK Ltd., Kanagawa (JP)

( * ) Notice: Subject to any disclaimer, the term of this patent is extended or adjusted under 35 U.S.C. 154(b) by 0 days.

(21) Appl. No.: 15/461,610

(22) Filed: Mar. 17, 2017

(65) Prior Publication Data
US 2017/0278731 A1 Sep. 28, 2017

(30) Foreign Application Priority Data

Mar. 22, 2016 (JP) .................................. 2016-057440

(51) Int. Cl.
*G05B 13/04* (2006.01)
*G05D 23/19* (2006.01)
*H01L 21/67* (2006.01)

(52) U.S. Cl.
CPC ...... *H01L 21/67103* (2013.01); *G05B 13/041* (2013.01); *G05D 23/1917* (2013.01); *H01L 21/67069* (2013.01); *H01L 21/67109* (2013.01); *H01L 21/67248* (2013.01)

(58) Field of Classification Search
None
See application file for complete search history.

(56) References Cited

U.S. PATENT DOCUMENTS

2016/0109867 A1* 4/2016 Wada ................... G05B 17/02
703/13

FOREIGN PATENT DOCUMENTS

JP 2016-012228 1/2016

* cited by examiner

*Primary Examiner* — Ryan A Jarrett
(74) *Attorney, Agent, or Firm* — Fish & Richardson P.C.

(57) ABSTRACT

A manipulated variable calculator having a plurality of control loops and configured to calculate manipulated variables to be respectively given to a plurality of temperature adjusters includes: a reference model output generator configured to generate a reference model that generates a response output until reaching a temperature setpoint when, in the plurality of control loops, a manipulated variable of a control loop having the slowest response speed is defined as 100%; a simulator configured to sequentially search for a switching time to determine a manipulated variable pattern; a reference model configured to generate a reference model output based on the searched switching time; and a reference model selecting unit configured to select the reference model depending on a heating responsiveness and a cooling responsiveness of the temperature adjusters.

3 Claims, 14 Drawing Sheets

US 10,325,788 B2

TEMPERATURE CONTROLLER OF SEMICONDUCTOR WAFER AND TEMPERATURE CONTROL METHOD OF SEMICONDUCTOR WAFER

The entire disclosure of Japanese Patent Application No. 2016-057440 filed Mar. 22, 2016 is expressly incorporated by reference herein.

TECHNICAL FIELD

The present invention relates to a temperature controller of a semiconductor wafer and a temperature control method of a semiconductor wafer.

BACKGROUND ART

A process for treating a semiconductor wafer (e.g., a silicon wafer) used for a semiconductor includes controlling an in-plane temperature distribution of the semiconductor wafer as desired while controlling a temperature of the semiconductor wafer to a temperature setpoint.

Accordingly, the temperature of the semiconductor wafer is typically controlled to a desired temperature by providing a plurality of temperature adjusters and control loops to the respective temperature adjusters and independently controlling the temperature adjusters with the control loops. As one of such multi-input multi-output control methods, a model following servo control method is used.

The model following servo control method includes: selecting a model (e.g., a second-order lag system) having dynamic characteristics generally desired as a reference model; and providing a setpoint response to make a control variable to follow a step response of the reference model as a reference trajectory.

In order to improve a throughput in the process, it is desirable to intentionally saturate the manipulated variable to reach a setpoint at the maximum speed in the shortest time.

Patent Literature 1 (JP2016-12228A) discloses a technology of generating a reference model based on a response in which, in a plurality of control loops, a manipulated variable of a first control loop having the slowest response speed is defined as 100% and the rest of the control loops is controlled to follow the first control loop; with use of the generated reference model, searching for a manipulated variable pattern, using a predetermined evaluation function, for reaching the temperature setpoint in the shortest time; giving a manipulated variable of the searched optimal manipulated variable pattern to the reference model to obtain an output; and using the obtained output as a reference model output.

In the technology of Patent Literature 1, a single reference model is generated based on the dynamic characteristics in heating to provide the reference model output to be followed.

However, in a thermo-module such as Peltier element, the dynamic characteristics sometimes differ in heating and cooling. Since the dynamic characteristics in the heating exhibit a larger output, when the reference model output for the heating is used in the cooling, the reference model output precedes an actual output, so that uniformity cannot be kept.

When the reference model output for the cooling is used, the response speed becomes slow although the uniformity is ensured.

SUMMARY OF THE INVENTION

An object of the invention is to provide a temperature controller and a temperature control method of a semiconductor wafer which allow a temperature of the semiconductor wafer to follow a reference model output irrespective of a heating or a cooling and reach a temperature setpoint in and around the shortest time while keeping uniformity.

An aspect of the invention is a temperature controller of a semiconductor wafer using a plurality of temperature adjusters usable for heating and cooling the semiconductor wafer, the temperature controller configured to control temperatures of the respective temperature adjusters to adjust temperatures of the semiconductor wafer, the temperature controller including: a plurality of control loops respectively set in the plurality of temperature adjusters; a plurality of temperature detectors provided to the respective control loops and configured to detect the temperatures of the semiconductor wafer adjusted by the respective temperature adjusters; and a manipulated variable calculator configured to calculate manipulated variables to be respectively given to the temperature adjusters of the control loops based on the temperatures detected by the temperature detectors, the manipulated variable calculator including: a reference model generated based on a response in which, in the plurality of control loops, a manipulated variable of a first control loop having the slowest response speed is defined as 100% and the rest of the control loops is controlled to follow the first control loop; an optimal manipulated variable pattern searching unit configured to search online or in advance offline an optimal manipulated variable pattern for reaching a temperature setpoint in the shortest time of period, using the reference model; a reference model output generator configured to generate a reference model output to give to the reference model a manipulated variable of the optimal manipulated variable pattern searched by the optimal manipulated variable pattern searching unit; a model following servo calculator configured to use the reference model output obtained by the reference model output generator; and a reference model selecting unit configured to select one of a predetermined heating reference model and a predetermined cooling reference model depending on whether the temperature adjustment by the plurality of temperature adjusters is for heating or cooling, and apply the selected heating or cooling reference model to the reference model.

In the above aspect of the invention, it is preferable that the reference model selecting unit is configured to select the reference model based on: a heating or cooling starting temperature when the manipulated variable is switched; a temperature setpoint; and an equilibrium temperature.

In the above aspect of the invention, it is preferable to further include a reference model cluster and an optimal control gain cluster of a number of combinations of heating and cooling in the plurality of control loops configured to heat or cool, in which it is preferable that the reference model selecting unit selects the reference model from the reference model cluster to output the reference model to the reference model output generator and selects an optimal control gain from the optimal control gain cluster to output the optimal control gain to the model following servo calculator.

Another aspect of the invention is a temperature control method of a semiconductor wafer using a plurality of temperature adjusters usable for heating and cooling the semiconductor wafer, the temperature control method of controlling temperatures of the plurality of temperature adjusters using control loops respectively set in the temperature adjusters, the temperature control method including: generating a reference model based on a response in which, in the control loops, a manipulated variable of a first control loop having the slowest response speed is defined as 100% and the rest of the control loops is controlled to follow the first control loop; selecting a heating reference model or a cooling reference model depending on whether a to-be-controlled temperature adjuster of the plurality of temperature adjusters is to be heated or to be cooled; searching for, online or in advance offline using the reference model, an optimal manipulated variable pattern for reaching a temperature setpoint in the shortest time; giving to the selected reference model a manipulated variable of the searched optimal manipulated variable pattern to generate a reference model output; and using the generated reference model output to perform a model following servo control.

According to the above aspects of the invention, the reference model output can be generated depending on a heating responsiveness or a cooling responsiveness of the temperature adjusters since the reference model selecting unit is provided, so that the reference model output can be followed irrespective of a heating or a cooling and a temperature setpoint can be reached in and around the shortest time while keeping uniformity.

BRIEF DESCRIPTION OF DRAWING(S)

DESCRIPTION OF EMBODIMENT(S)

Exemplary embodiment(s) of the invention will be described below with reference to the attached drawings.

[1] Structure of Temperature Adjustment Apparatus 1

Figure 1:
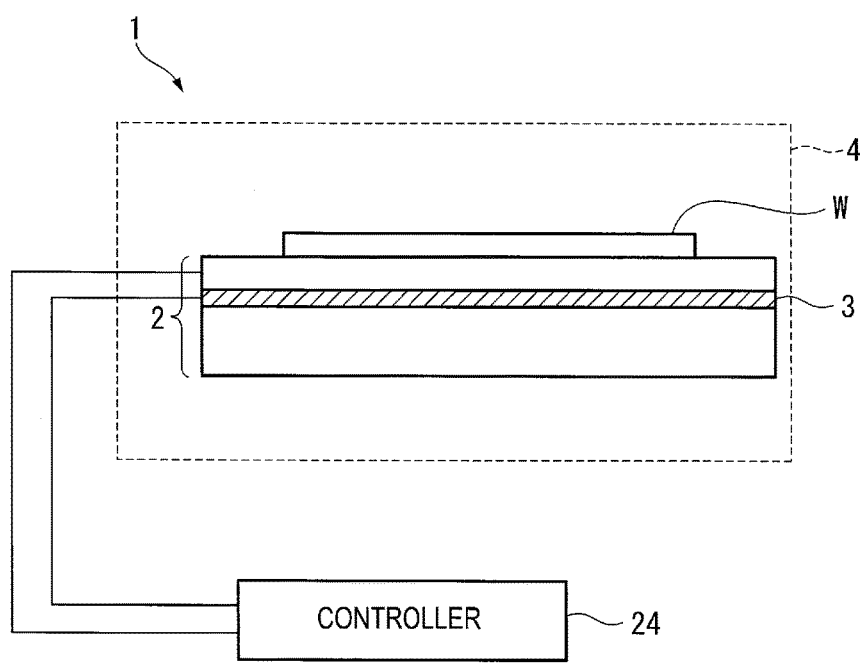
FIG. 1 is a block diagram showing a temperature adjustment apparatus according to an exemplary embodiment of the invention.

FIG. 1 shows a temperature adjustment apparatus 1 according to a first exemplary embodiment of the invention. The temperature adjustment device 1 controls a temperature of a silicon wafer W placed on a plate-shaped stage 2 to a temperature setpoint to control an in-plane temperature distribution of the silicon wafer W. The temperature adjustment apparatus 1 is used, for instance, in a dry etching process.

The temperature adjustment device 1 includes the plate-shaped stage 2 and a temperature adjuster 3. The temperature adjuster 3, which is configured to heat or cool a target zone of the stage 2, is preferably in a form of a thermoelectric conversion element such as a Peltier element. When the temperature adjuster 3 is used only for heating, a heater is usable as the temperature adjuster 3.

The stage 2 is disposed in a vacuum chamber 4. The silicon wafer W (semiconductor wafer) is placed on the stage 2. The silicon wafer W is electrostatically held on the stage 2. It should be noted that helium gas may be delivered between the stage 2 and the silicon wafer W to enhance efficiency in heat transfer between the stage 2 and the silicon wafer W.

In the dry etching process, the vacuum chamber 4 is air-purged to be kept at a predetermined low pressure state.

Figure 2A:
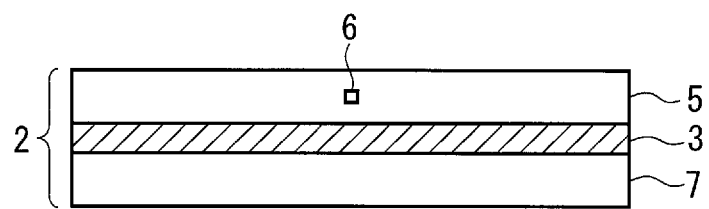
FIG. 2A is a cross-sectional view showing the arrangement of a temperature adjuster and a temperature sensor in the exemplary embodiment.
Figure 2B:
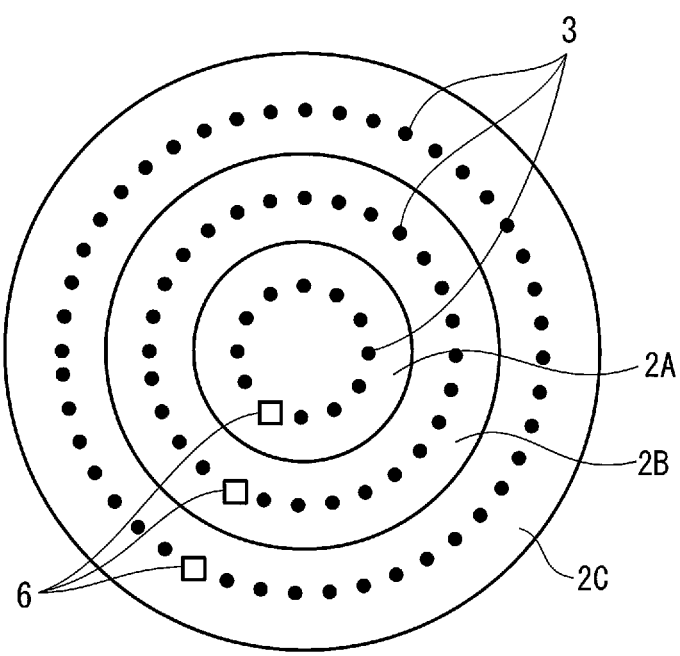
FIG. 2B is a plan view showing the arrangement of the temperature adjuster and the temperature sensor in the exemplary embodiment.

In the stage 2, a plurality of temperature adjusters 3 are disposed as shown in FIGS. 2A and 2B so as to adjust the in-plane temperature distribution of the silicon wafer W placed on the stage 2.

FIG. 2A is a cross-sectional view of the stage 2. The temperature adjusters 3 are disposed on a base plate 7. A plate 5 is placed on the temperature adjusters 3. A plurality of temperature sensors 6 (temperature detectors) are disposed in the plate 5.

FIG. 2B is a plan view of the stage 2, showing that the stage 2 is divided into three concentric zones 2A (a zone 1 described later), 2B (a zone 2 described later) and 2C (a zone 3 described later), in each of which the temperature adjusters 3 are disposed. The temperature sensors 6 (temperature detectors) in the plate 5 are disposed at positions corresponding to the temperature adjusters 3.

The zones 2A, 2B and 2C of the stage 2 can be independently heated or cooled by electrifying the temperature adjusters 3. Accordingly, by adjusting electrification to the temperature adjusters 3 to control the temperature adjusters 3, the in-plane temperature distribution of the silicon wafer W on the stage 2 is adjustable. The temperature adjusters 3 in each of the zones 2A, 2B and 2C have a plurality of control loops and are controlled by a controller 24 serving as a temperature controller.

2. Structure of Controller 24

Figure 3:
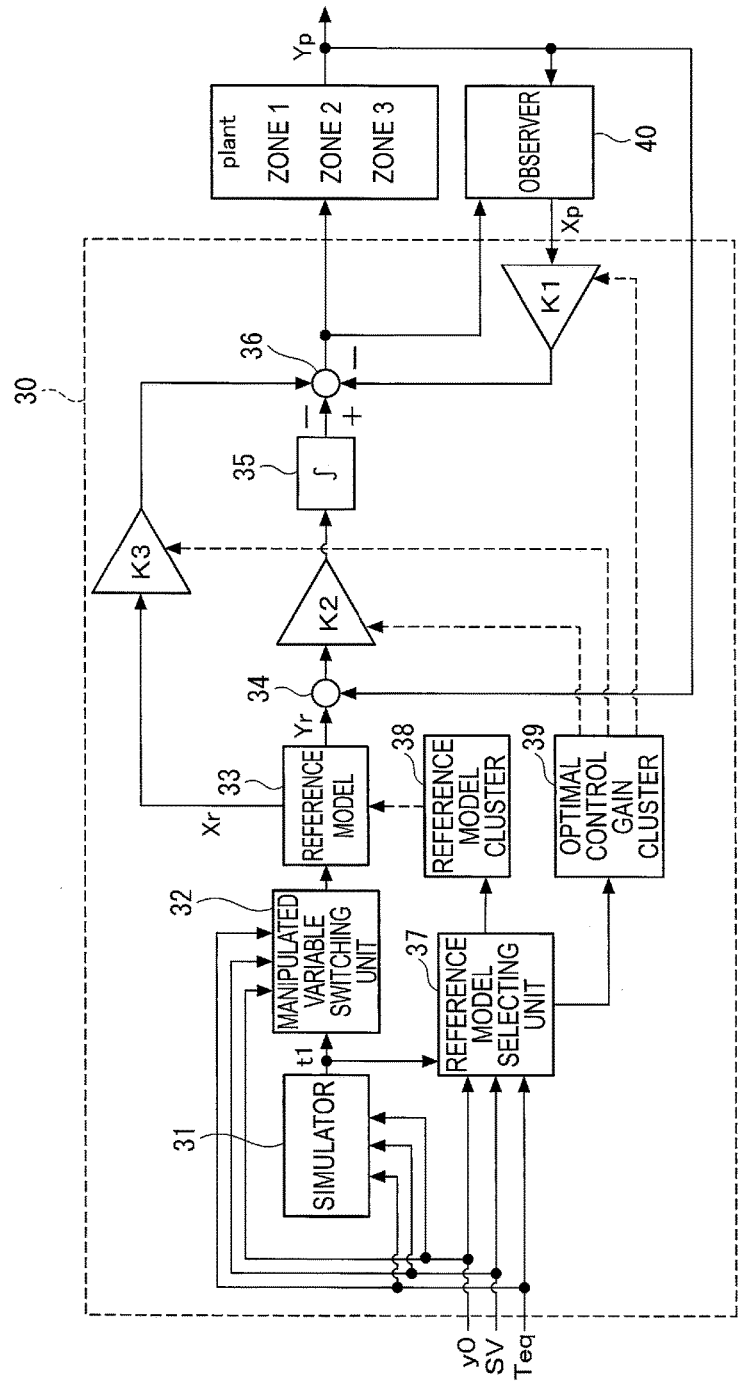
FIG. 3 is a block diagram showing a configuration of a controller configured to control the temperature adjustment apparatus in the exemplary embodiment.

FIG. 3 shows a block diagram showing the controller 24 in the exemplary embodiment. The controller 24 includes a manipulated variable calculator 30 serving as a manipulated variable calculating unit. The manipulated variable calculator 30 includes: a simulator 31 serving as an optimal manipulated variable pattern searching unit; a manipulated variable switching unit 32; a reference model 33; an error calculator 34 serving as a model following servo calculator; an integrator 35; and an error calculator 36. The simulator 31 and the manipulated variable switching unit 32 define a reference model output generator of the invention.

The manipulated variable calculator 30 in the exemplary embodiment further includes: a reference model selecting unit 37 serving as a reference model selecting unit; a reference model cluster 38; an optimal control gain cluster 39; and an observer 40.

A state feedback gain K1 is set through the observer 40 for an output from the temperature sensor 6 of the stage 2. An integral gain K2 is set for an output from the error calculator 34. A state feedforward gain K3 is set for an output from the reference model 33. An input to each of the components in each of the block diagrams is shown below.

SV: temperature setpoint
y0: starting temperature at a time of switching
Teq: equilibrium temperature
Xr: state quantity of a reference model
Yr: reference trajectory
t1: switching time
Xr: state quantity of a plant
Yp: control variable (temperature)

Given that the stage 2 (control target) is controlled by multi-input multi-output in a form of an m-input m-output system, a state variable of the control target is expressed by formulae (1) and (2) below.

$$x_p(k+1) = A_p x_p(k) + B_p u(k) \quad (1)$$

$$y(k) = C_p x_p(k) \quad (2)$$

wherein
$x_p$:n×1, u:m×1, y:m×1, $A_p$:n×n, $B_p$:n×m, $C_p$:m×n each of which shows a vector or a matrix.

Herein, the gain matrixes K1, K2 and K3 are represented by a formula (3) below. depends on an order of the reference model.

$$K1: m \times n, \ K2: m \times p, K3: m \times m \quad (3)$$

The reference model 33 selectively employs a linear system (a state equation and a transfer function) having a desired response (dynamic characteristics), in which control variables are made to follow a step response without an error. In the multi-input multi-output system, as long as the same reference model 33 is used for all the loops, a response follows the same reference trajectory, so that uniformity among the loops can be expected.

The gains (K1, K2, K3) of each of the components are determined according to an optimal control method. This method is applicable with merits of the optimal control (i.e., stability guaranty and robustness) and without considering decoupling and is suitable for the multi-input multi-output system with interaction such as the control target described herein.

In the exemplary embodiment, an ideal response for the requirement of "reaching a temperature setpoint in the shortest time" is obtained in the following manner.

Figure 4:
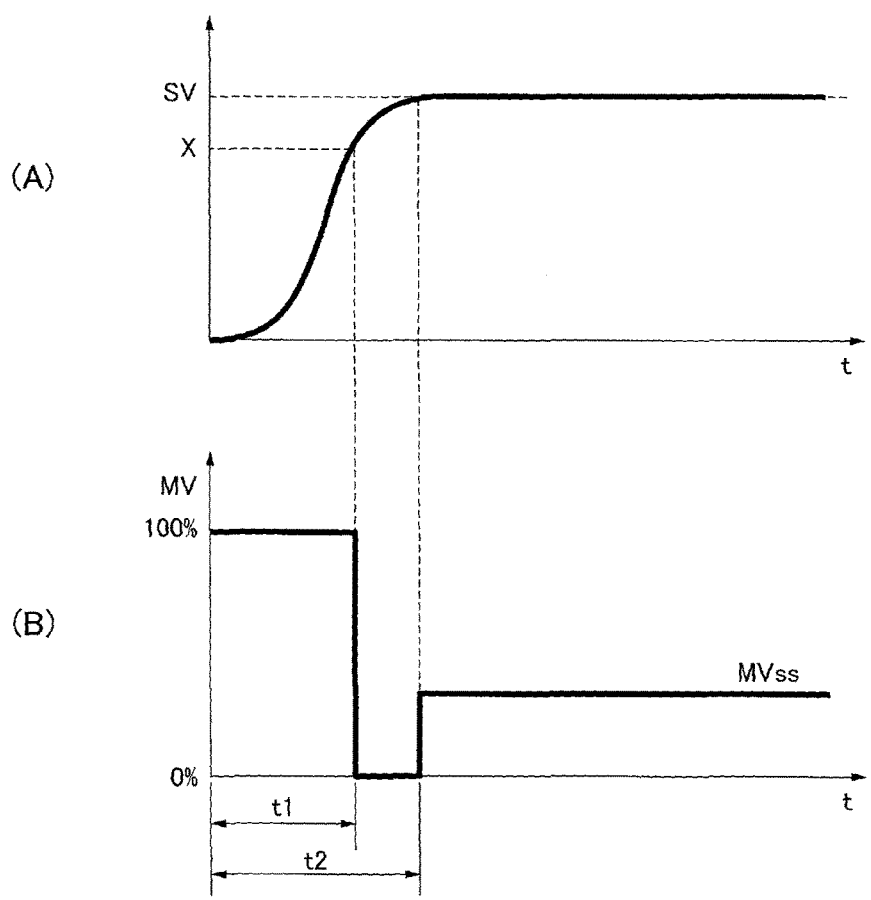
FIG. 4 is a graph for explaining a reference model in the exemplary embodiment.

As shown in FIG. 4, a manipulated variable pattern for reaching a temperature setpoint SV in the shortest time is achieved by accelerating with the maximum manipulated variable to an intermediate point X, decelerating with the minimum manipulated variable from the point X to the temperature setpoint SV, and switching from the minimum manipulated variable to a steady state manipulated variable MVss required for keeping a current level after reaching the temperature setpoint SV.

Figure 5A:
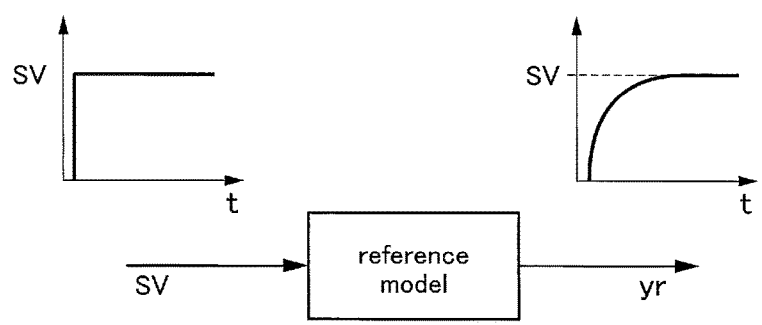
FIG. 5A is a diagram for explaining generation of the reference model in the exemplary embodiment.

When this manipulated variable pattern is inputted to a plant model, the plant should reach a setpoint in the shortest time. Accordingly, although a step input is only given to a transfer function showing a desirable step response in a typical model following control as shown in FIG. 5A, it is considered to input a manipulated variable pattern for controlling in the shortest time to the plant model itself as shown in FIG. 5B.

Figure 5B:
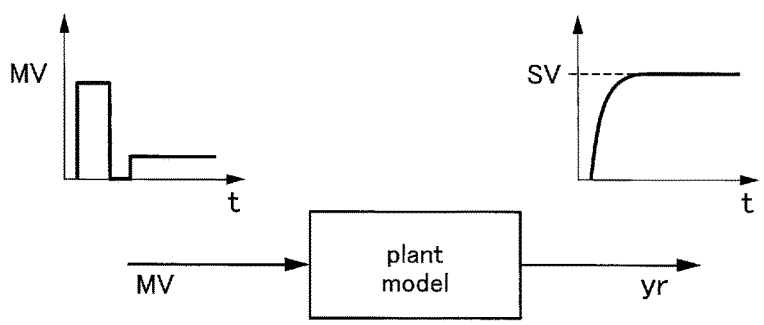
FIG. 5B is another diagram for explaining generation of the reference model in the exemplary embodiment.

In the multi-input multi-output system, the number of the manipulated variable patterns as shown in FIG. 5B needs to be equal to the number of the control loops. Moreover, unless the control variables of the respective control loops are uniform under interaction, the reference trajectory to be followed is also not uniform. Since it is very difficult to make such manipulated variable patterns only in a combination of step signals, the following method is taken.

(1) Using a plant model Gp(s) or an actual plant, the maximum speed response is determined while keeping uniformity of the control variables of the respective control loops. A 100% maximum manipulated variable MVmax is given to a first zone at the slowest speed response among three zones. The remaining two zones are each given a manipulated variable at which the remaining two zones realize the maximum speed while keeping uniformity when following the first zone.

(2) The control loop having the slowest speed response is selected from response waveforms obtained in (1). Assuming that the slowest speed response of the control loop is a response by a step input, a reference model Gm(s) of a dead time+a first-order lag system is obtained by a system identification.

(3) With respect to the reference model Gm(s) obtained in (2), a manipulated variable for achieving an optimal time control is determined by sequential simulation. Herein, an optimal value of a switching time t1 is searched for as a value for switching from the maximum manipulated variable to a steady state manipulated variable after the elapse of t1 seconds.

As an evaluation function used for searching for the optimal value, IAE (Integral of Absolute Error) (described in detail later) evaluation model is employed to search for a manipulated variable pattern allowable for the minimum evaluation function.

(4) By using the reference model Gm(s) for all the inputs and the outputs, the reference trajectory is used in common for all the control loops, so that uniformity of the control variables among the control loops can be expected. It is also possible to prepare reference models corresponding in number to the control loops and set different setpoints to the respective reference models.

The simulator 31 serving as the optimal manipulated variable pattern searching unit sequentially searches for a switching time t1 when the temperature setpoint SV is inputted, and outputs the obtained switching time t1 to the manipulated variable switching unit 32. It should be noted that the search may be made online, or alternatively, offline in advance.

The manipulated variable switching unit 32 determines the manipulated variable pattern MVref for switching from the maximum manipulated variable MVmax to the steady state manipulated variable MVss, and outputs the manipulated variable pattern MVref to the reference model 33. Although the optimal time is sequentially searched for online by the simulator 31 in the exemplary embodiment, the optimal time may be obtained in any manner. A table of the manipulated variable pattern for a control target, in which the temperature setpoint SV is associated with the optimal time for reaching the temperature setpoint SV in the shortest time, may be prepared offline in advance. When the temperature setpoint SV is inputted, the optimal manipulated variable pattern MVref may be selected with reference to the table.

Using the plant model Gp(s) or the actual plant as described above, the reference model 33 determines the maximum speed response achievable while keeping the control variables of the respective control loops, and gives the 100% manipulated variable to the slowest response speed zone. For instance, the reference model 33 is expressed by a dead time+a first-order lag system as represented by a formula (4) below.

$$Gm(s) = \frac{K}{Ts+1} \cdot e^{-Ls} \quad (4)$$

Patent Literature 1 discloses a technology in which only one reference model generated based on results of a heating test is used. However, the thermo-module exhibits different dynamic characteristics depending on heating and cooling. Particularly, a cooling capability is smaller than a heating capability since a generated Joule heat acts for cancelling the cooling.

Accordingly, in the exemplary embodiment, considering both of the heating reference model and the cooling reference model, the reference model cluster 38 and the optimal control gain cluster 39 each in number corresponding to eight ($2^3$) combinations of the heating and the cooling of the zones 1 to 3 are prepared and selected by the reference model selecting unit 37.

The reference model collectively for all the zones (three zones) is represented by state equations (5) and (6).

$$X_r(k+1) = A_r X_r(k) + B_r U_r(k) \quad (5)$$

$$Y_r(k) = C_r X_r(k) \quad (6)$$

Herein, matrixes $A_r$, $B_r$, $C_r$, $X_r$ and $Y_r$ are represented by formulae (7), (8) and (9). A combination of the heating h and the cooling c is described in a subscript [ ].

$$A_r = \begin{bmatrix} A_{[]} & 0 & 0 \\ 0 & A_{[]} & 0 \\ 0 & 0 & A_{[]} \end{bmatrix} \quad B_r = \begin{bmatrix} B_{[]} & 0 & 0 \\ 0 & B_{[]} & 0 \\ 0 & 0 & B_{[]} \end{bmatrix} \quad (7)$$

$$C_r = \begin{bmatrix} C_{[]} & 0 & 0 \\ 0 & C_{[]} & 0 \\ 0 & 0 & C_{[]} \end{bmatrix}$$

$$X_r(k) = [\, x_{r11}(k) \;\; x_{r12}(k) \;\; x_{r21}(k) \;\; x_{r22}(k) \;\; x_{r31}(k) \;\; x_{r32}(k) \,]^T \quad (8)$$

$$Y_r(k) = [\, y_{r1} \;\; y_{r2} \;\; y_{r3} \,]^T \quad (9)$$

$$U_r(k) = [\, u_{r1}(k) \;\; u_{r2}(k) \;\; u_{r3}(k) \,]^T$$

Since there are the eight combinations of the heating and the cooling of the three zones as described above, the matrixes $A_r$, $B_r$ and $C_r$ each include the eight combinations, thereby defining the reference model cluster 38. For instance, the reference model cluster 38 is represented by a formula (10). Herein, the subscripts 1, 2 ... 8 of the matrixes $A_r$, $B_r$ and $C_r$ represent the combinations of the heating and the cooling in the formula (7).

$$\begin{bmatrix} A_{r1} & B_{r1} \\ C_{r1} & 0 \\ A_{r2} & B_{r2} \\ C_{r2} & 0 \\ \vdots & \vdots \\ A_{r7} & B_{r7} \\ C_{r7} & 0 \\ A_{r8} & B_{r8} \\ C_{r8} & 0 \end{bmatrix} \quad (10)$$

Next, state equations of the plant model are assumed as formula (11) and (12).

$$X_p(k+1) = A_p X_p(k) + B_p U_p(k) \quad (11)$$

$$Y_p(k) = C_p X_p(k) \quad (12)$$

Augmented system for the model following servo system is represented by formulae (13) and (14).

$$X_a(k+1) = \begin{bmatrix} \Delta X_p(k+1) \\ \Delta X_r(k+1) \\ e(k+1) \end{bmatrix} = \begin{bmatrix} A_p & 0 & 0 \\ 0 & A_r & 0 \\ -C_p A_p & C_r A_r & I \end{bmatrix} \begin{bmatrix} \Delta X_p(k) \\ \Delta X_r(k) \\ e(k) \end{bmatrix} + \begin{bmatrix} B_p \\ 0 \\ -C_p B_p \end{bmatrix} \Delta U_p(k) \quad (13)$$

$$= A_a X_a(k) + B_a \Delta U_p(k)$$

$$e(k) = [\, 0 \;\; 0 \;\; I \,] \begin{bmatrix} \Delta X_p(k) \\ \Delta X_r(k) \\ e(k) \end{bmatrix} = C_a X_a(k) \quad (14)$$

$\Delta X_p(k+1)$, $\Delta X_r(k+1)$, and $e(k)$ are respectively represented by formulae (15), (16) and (17) below.

$$\Delta X_p(k+1) = X_p(k+1) - X_p(k) = A_p \Delta X_p(k) + B_p \Delta U_p(k) \quad (15)$$

$$\Delta X_r(k+1) = X_r(k+1) - X_r(k) = A_r \Delta X_r(k) + B_r \Delta U_r(k) \quad (16)$$

$$e(k) = Y_r(k) - Y_p(k) \quad (17)$$

When an input showing the minimum evaluation function in the formula (17) is obtained with respect to the formulae (13) and (14), the input is represented by a formula (18).

$$J = \sum_{k=1}^{\infty} (\|e(k)\|_Q^2 + \|\Delta U_p(k)\|_R^2) \quad (17)$$

$$\Delta U_p(k) = K_1 \Delta X_p + K_2 \Delta X_r(k) + K_3 e(k) \quad (18)$$

When the formula (18) is solved with respect to $U_p(k)$, $U_p(k)$ is represented by a formula (19) below.

$$U_p(k) = K_1 X_p(k) + K_2 X_r(k) + K_3 \sum_{j=1}^{k} e(j) \quad (19)$$

Given that G11=[K1 K2 K3], the gains are obtained by solving a corresponding Riccati equation. Here, when the gain G11 is applied to the reference model cluster represented by the formula (10) as described above, the gain G11 also has $2^3$ combinations=eight combinations, which is called an optimal control gain cluster GC exemplarily represented by a formula (20).

$$GC = \begin{bmatrix} G11_1 \\ G11_2 \\ \vdots \\ G11_8 \end{bmatrix} \quad (20)$$

The simulator 31 selects the switching time t1 based on a starting temperature y0 and the temperature setpoint SV and determines a heating or cooling pattern of each of the zones 1 to 3 based on the equilibrium temperature Teq as well as the selected switching time t1. The determined pattern is inputted to the reference model cluster 38 and the optimal control gain cluster 39.

The maximum manipulated variable MVmax and the steady state manipulated variable MVss which are to be inputted to the reference model 33 are calculated based on the starting temperature y0 and the temperature setpoint SV and inputted to the reference model selected from the reference model cluster 38. Simultaneously, the model following servo control is executed using the gains K1, K2 and K3 selected from the optimal control gain cluster 39. It should be noted that the observer 40 as shown in FIG. 3 is an estimator configured to estimate an internal state quantity of a control target (plant) unobservable with a sensor.

3. Operations in Embodiment(s)

Figure 6:
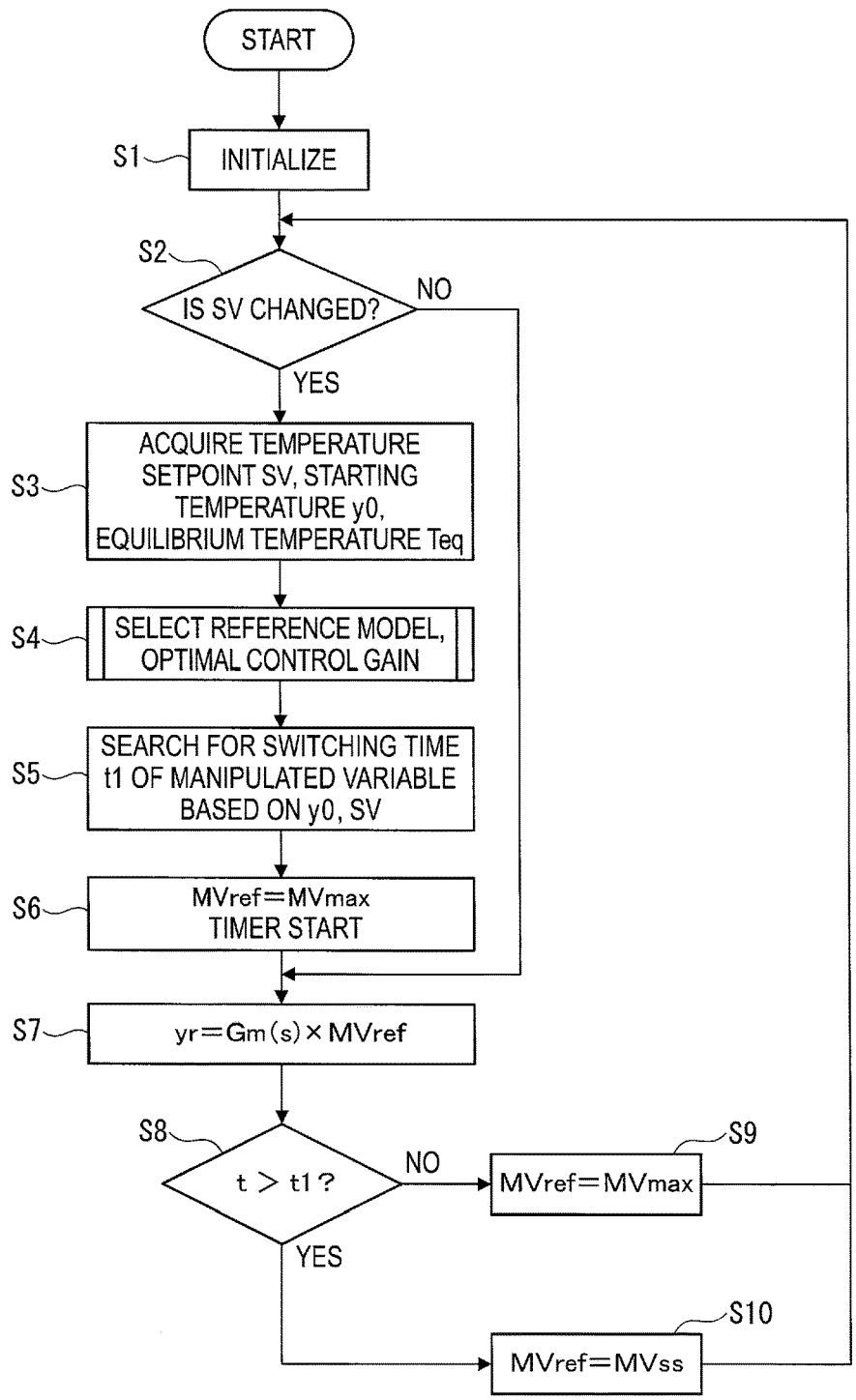
FIG. 6 is a flow chart for explaining an operation in the exemplary embodiment.

Next, operations of a temperature control method of a semiconductor wafer in the exemplary embodiment will be described with reference to flow charts shown in FIGS. 6 and 7.

The manipulated variable calculator 30 of the controller 24 drives and initializes an apparatus (Step S1).

The manipulated variable calculator 30 judges whether the temperature setpoint SV is changed or not (Step S2). When the temperature setpoint SV is not changed, the manipulated variable calculator 30 generates a reference model output yr in Step S7 described later and continues controlling.

When the temperature setpoint SV is changed, the reference model selecting unit 37 acquires the temperature setpoint SV, the starting temperature y0 and the equilibrium temperature Teq (Step S3).

Based on the acquired the temperature setpoint SV, the starting temperature y0 and the equilibrium temperature Teq, the reference model selecting unit 37 selects a reference model and an optimal gain and applies the reference model and the optimal gain to the reference model 33 (Step S4).

Figure 7:
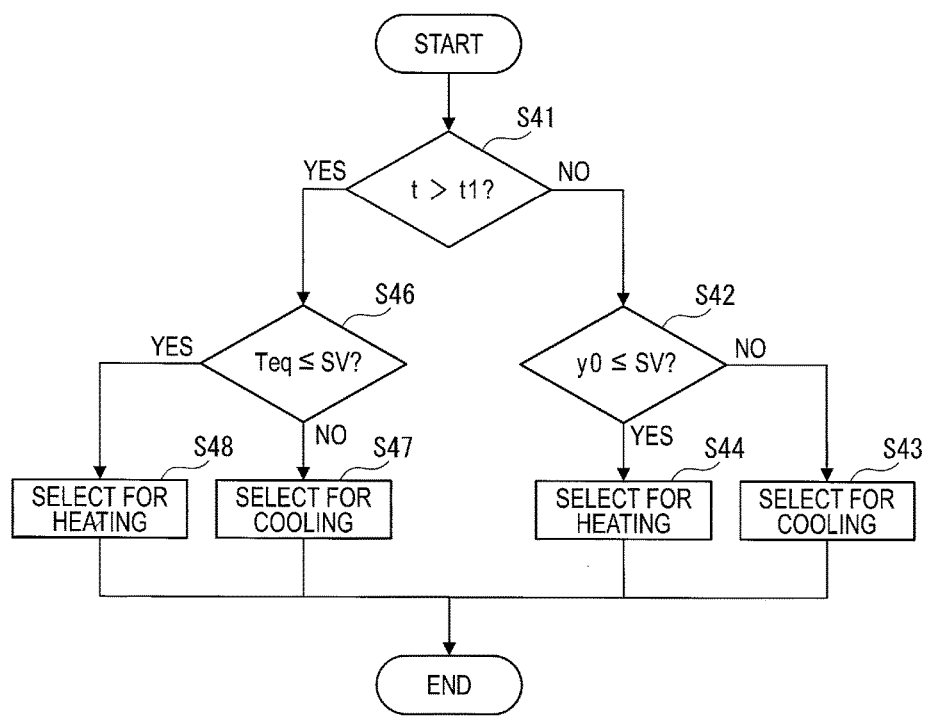
FIG. 7 is a flow chart for explaining another operation in the exemplary embodiment.

The reference model and the optimal gain are selected according to the flow chart shown in FIG. 7.

Firstly, as shown in FIG. 7, the reference model selecting unit 37 judges whether the judgment of the heating or the cooling is made when the manipulated variable is at the maximum manipulated variable MVmax or the steady state manipulated variable MVss in a single time of heating or cooling process (Step S41).

When the reference model selecting unit 37 determines that the judgment of the heating or the cooling is made when the manipulated variable is at the maximum manipulated variable MVmax (Step S41: No), the reference model selecting unit 37 judges which of the starting temperature y0 in the heating or the cooling and the temperature setpoint SV is higher (Step S42).

When the reference model selecting unit 37 determines that the starting temperature y0 is higher than the temperature setpoint SV (Step S42: No), the reference model selecting unit 37 selects the cooling reference model from the reference model cluster 38 and the optimal control gain for cooling from the optimal control gain cluster 39 (Step S43).

When the reference model selecting unit 37 determines that the temperature setpoint SV is higher than the starting temperature y0 (Step S42: Yes), the reference model selecting unit 37 selects the heating reference model from the reference model cluster 38 and the optimal control gain for heating from the optimal control gain cluster 39 (Step S44).

When the reference model selecting unit 37 determines that the judgment of the heating or the cooling is made when the manipulated variable is at the steady state manipulated variable MVss (Step S41: Yes), the reference model selecting unit 37 judges which of the equilibrium temperature Teq and the temperature setpoint SV is higher (Step S46).

When the reference model selecting unit 37 determines that the equilibrium temperature Teq is higher than the temperature setpoint SV (Step S46: No), the reference model selecting unit 37 selects the cooling reference model from the reference model cluster 38 and the optimal control gain for cooling from the optimal control gain cluster 39 (Step S47).

When the reference model selecting unit 37 determines that the temperature setpoint SV is higher than the equilibrium temperature, the reference model selecting unit 37 selects the heating reference model from the reference model cluster 38 and the optimal control gain for heating from the optimal control gain cluster 39 (Step S48).

Referring back to FIG. 6, the simulator 31 searches for the switching time t1 based on the starting temperature y0 and the temperature setpoint SV (Step S5).

After the switching time t1 is searched for, the manipulated variable switching unit 32 inputs MVref=MVmax to the reference model 33.

The reference model 33 multiplies the generated reference model Gm(s) by the manipulated variable pattern MVref to obtain a reference model output and outputs the reference model output (Step S7).

The manipulated variable switching unit 32 monitors a timer and judges whether the switching time t1 has passed (Step S8). When judging that the switching time t1 has not passed, the manipulated variable switching unit 32 continues to output MVref=MVmax to the reference model 33 (Step S9).

When judging that the switching time t1 has passed, the manipulated variable switching unit 32 sets MVref=MVss (Step S10).

Based on the reference model output generated as described above, the model following servo calculator executes model following servo control.

Figure 8:
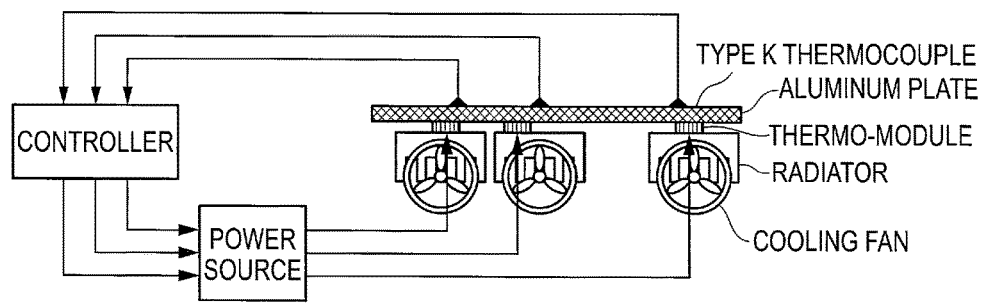
FIG. 8 is a diagram showing a control system used for simulation for checking effects in the exemplary embodiment.
Figure 9:
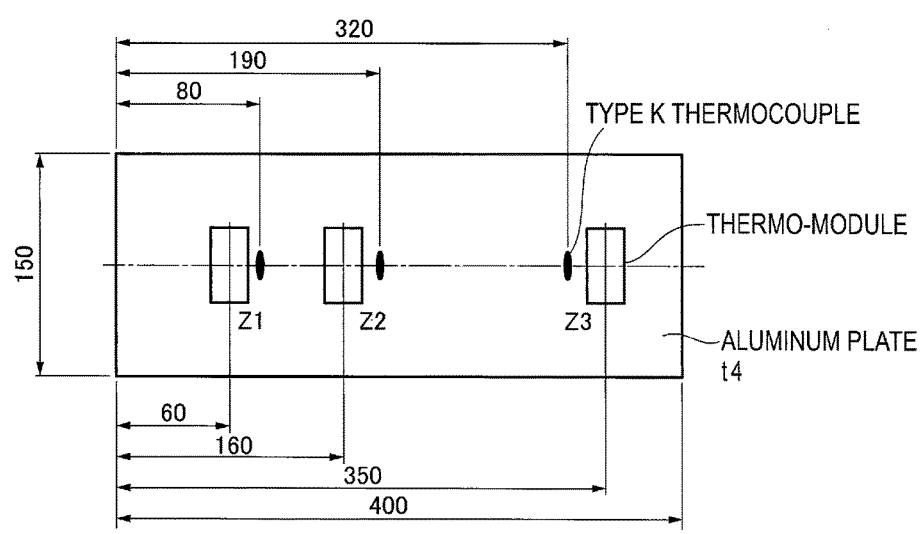
FIG. 9 is a plan view showing the control system used for simulation for checking the effects in the exemplary embodiment.

4. Check of Effects of Invention by Simulation 4-1. Structure of Control System in Simulation Control of a three-input three-output system will be exemplarily described with a simulation result obtained by modeling a control system shown in FIG. 8. This control system is a system for controlling a temperature of an aluminum plate of 400×150×t4 as shown in FIG. 9 and uses an actuator in a form of three thermo-modules configured to heat and cool the plate. The temperature of the aluminum plate is measured by three type K thermocouples provided near the respective modules. The thermo-module and the thermocouples are intentionally disposed asymmetrically relative to a longitudinal direction of the plate, which is shown in dimensional detail in FIG. 9. Zones 1, 2 and 3 are defined from the left in the figure.

4-2. Problems in Patent Literature 1

The reference model in Patent Literature 1 will be described in detail with respect to the searching method of the switching time when the reference model in Patent Literature 1 is defined as a dead time+a first-order lag system represented by a formula (21).

$$G_{mh}(s) = \frac{44.2}{178\ s+1} e^{-4s} \quad (21)$$

By replacing the dead time with a first-order Padé approximation in the formula (21), the formula (21) is represented by a formula (22).

$$G_{mh}(s) = \frac{-44.2\ s + 22.1}{178\ s^2 + 90\ s + 0.5} \quad (22)$$

When the formula (22) is further converted to a state equation of a discrete-time system (a sampling time: 0.1 second), the formula (22) is represented by formulae (23) and (24).

$$\begin{bmatrix} x_{h1}(k+1) \\ x_{h2}(k+1) \end{bmatrix} = \begin{bmatrix} 1.951 & -0.9507 \\ 1 & 0 \end{bmatrix} \begin{bmatrix} x_{h1}(k) \\ x_{h2}(k) \end{bmatrix} + \begin{bmatrix} 0.25 \\ 0 \end{bmatrix} u(k) \quad (23)$$

$$y(k) = [-0.09441 \quad 0.09926] \begin{bmatrix} x_{h1}(k) \\ x_{h2}(k) \end{bmatrix} \quad (24)$$

Considering the response in the formulae (23) and (24), since initial conditions differ depending on the starting temperature y0 in the heating, it is necessary to input two of the starting temperature y0 and the temperature setpoint SV in order to search for the switching time t1. Here, assuming that the temperature is steady at the starting temperature y0, the initial conditions $x_{h1}(0)$ and $x_{h2}(0)$ at the starting temperature y0 are represented by a formula (25).

$$\begin{bmatrix} x_{h1}(0) \\ x_{h2}(0) \end{bmatrix} = \begin{bmatrix} C_h \\ C_h A_h \end{bmatrix}^{-1} \begin{bmatrix} y0 \\ y0 \end{bmatrix} \quad (25)$$

$A_h$ and $C_h$ correspond to coefficient matrixes (see formula (26)) in the formulae (23) and (24).

$$A_h = \begin{bmatrix} 1.951 & -0.9507 \\ 1 & 0 \end{bmatrix},\ B_h = \begin{bmatrix} 0.25 \\ 0 \end{bmatrix},$$
$$C_h = [-0.09441 \quad 0.09926] \quad (26)$$

The switching time t1 is searched for in the heating (cooling) range expectable according to the formulae (23) to (25). Consequently, a two-dimensional table in which an input is represented by y0 and SV and an output is represented by the switching time t1 is obtained. Table 1 shows an example of the two-dimensional table.

In the table showing that, for instance, the starting temperature y0 being 10 degrees C. and the temperature setpoint SV being 30 degrees C. provide the switching time being 153.9 seconds. Since the input is given at every interval of 5 degrees C., temperatures in the interval are obtained by interpolation, but the interval may be decreased.

Figure 10:
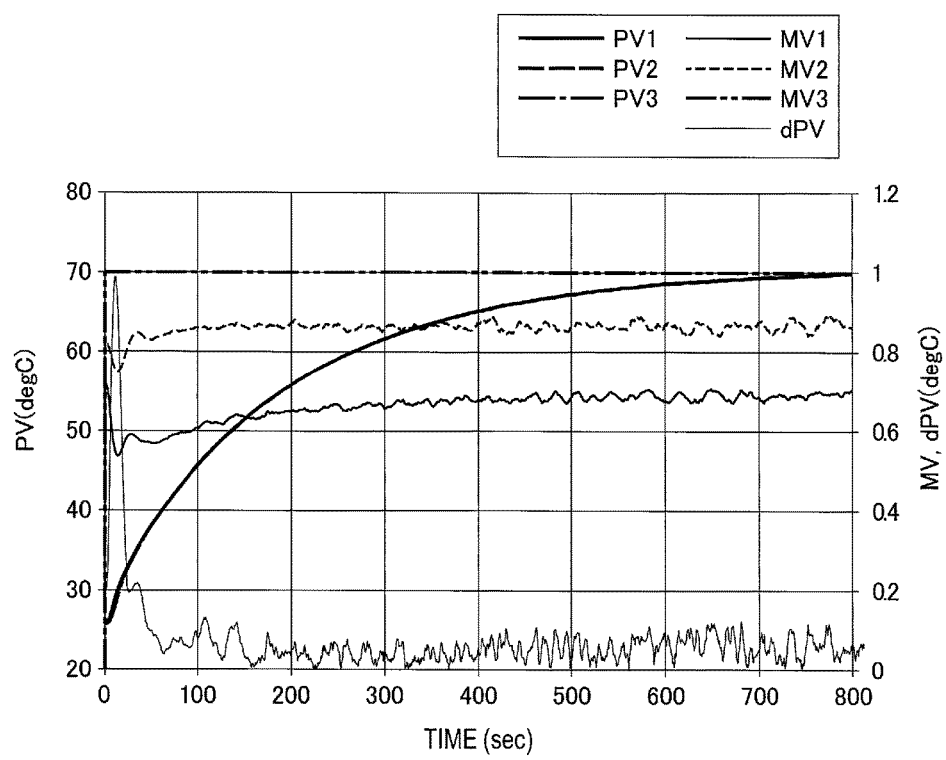
FIG. 10 is a graph showing the maximum response waveform of the temperature adjuster in heating.
Figure 11:
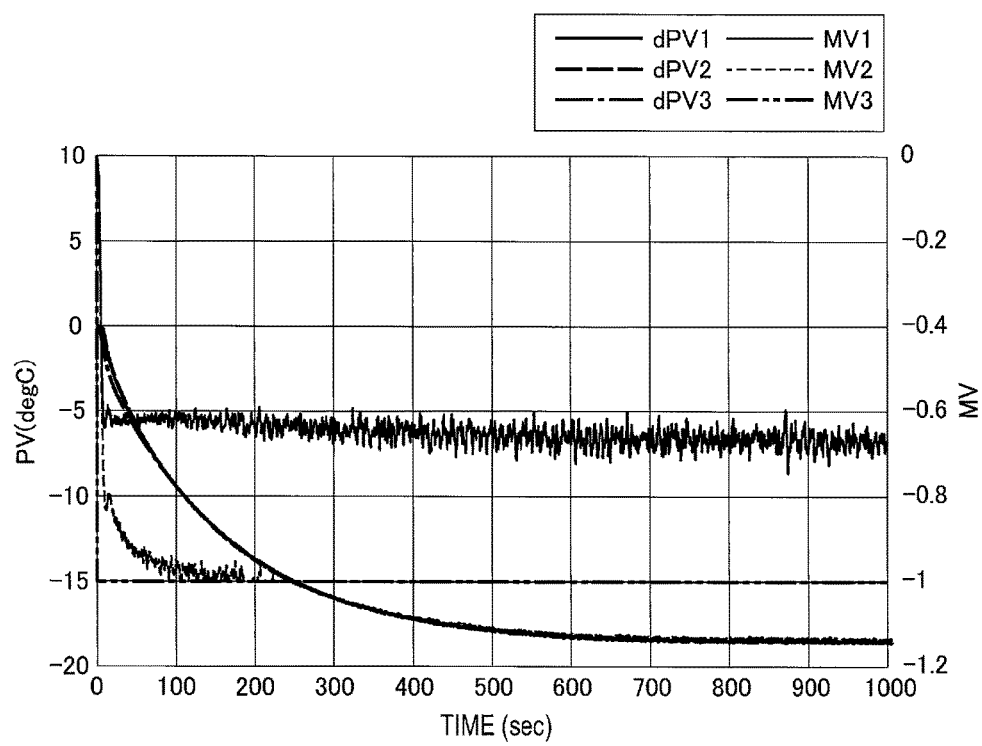
FIG. 11 is a graph showing the maximum response waveform of the temperature adjuster in cooling.

In the technology of Patent Literature 1, the formula (22) is used as the reference model based on results of the heating test shown in FIG. 10. However, since the thermo-module exhibits different dynamic characteristics depending on heating and cooling, the thermo-module exhibits a behavior as shown in FIG. 11 in the cooling test, the behavior being not always in conformity with a behavior in the heating test. For instance, the characteristics in the cooling shown in FIG. 11 are represented by a formula (27).

$$G_{mc}(s) = \frac{18.4}{142\ s + 1} e^{-4s} \quad (27)$$

Figure 12:
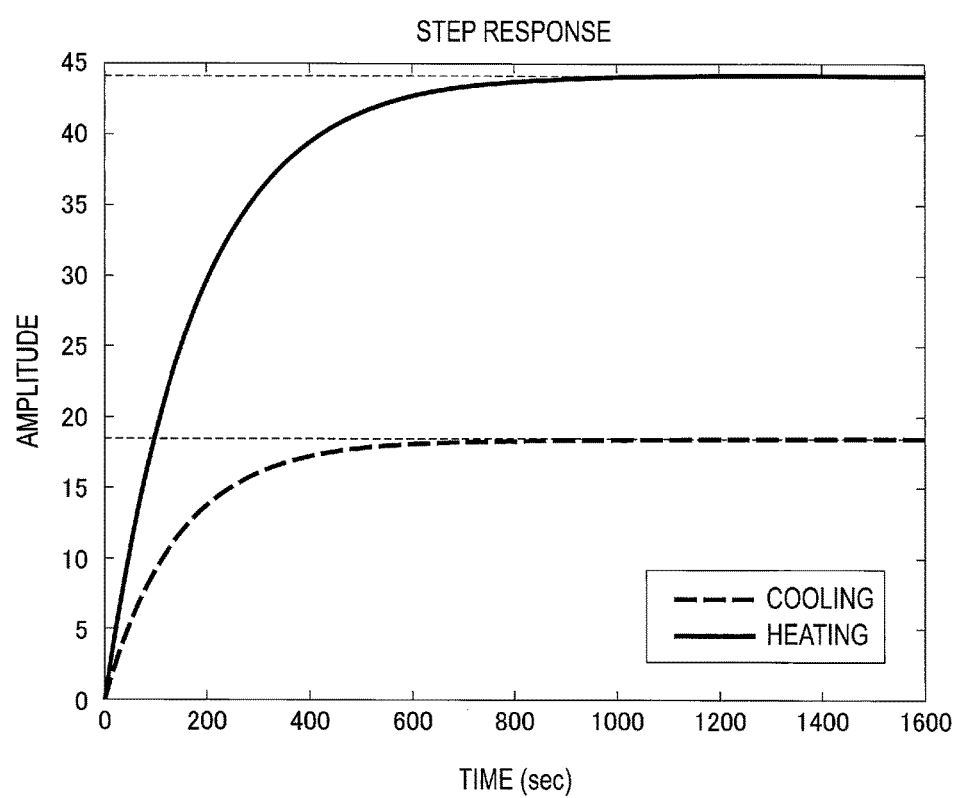
FIG. 12 is a graph showing a comparison between a heating responsiveness and a cooling responsiveness of the temperature adjuster.

The comparison results between step responses according to the formulae (22) and (27) are shown in FIG. 12, from which it is found that the step response in the heating is quicker.

Figure 13:
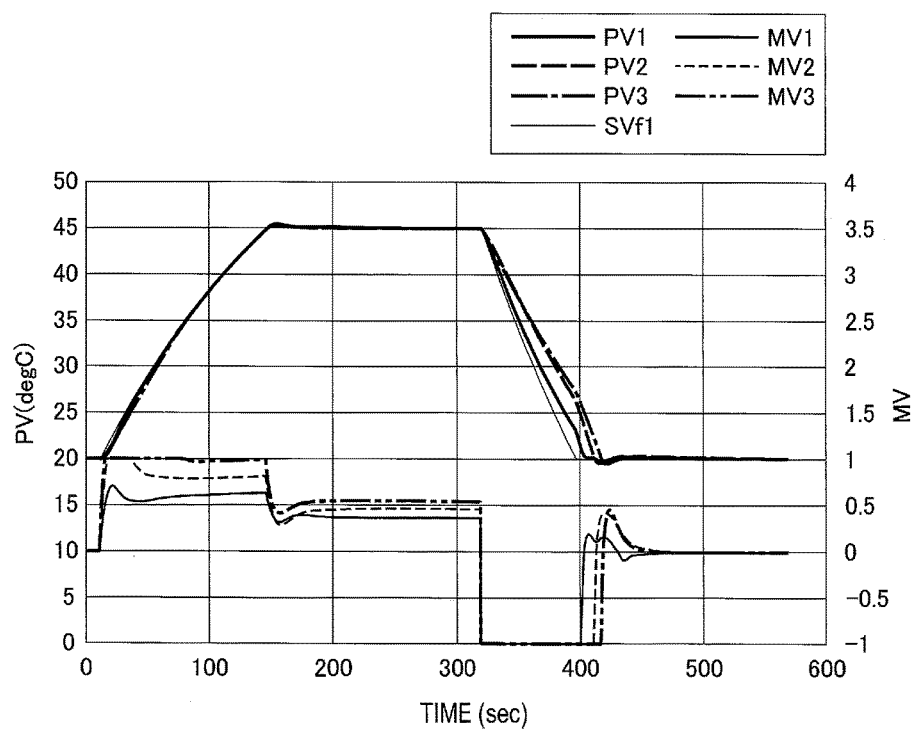
FIG. 13 is a graph showing simulation results in the related art.

Because of this difference in the dynamic characteristics, when the thermo-module is controlled to be cooled only using the heating reference model, as exemplarily shown by simulation results in FIG. 13, the reference model output precedes in the cooling and the actual outputs PV1 to PV3 cannot follow the reference model output since the manipulated variables MV1 to MV3 are restricted to saturation, so that the uniformity cannot be ensured.

4-3 Simulation in Embodiment(s)

In the exemplary embodiment, considering both of the heating reference model and the cooling reference model, the reference model cluster and the optimal control gain cluster are prepared in number corresponding to combinations of 2^ (the number of the zones) (i.e., exponentiating 2 with the number of the zones) of the heating and the cooling of the zones, and are switched in use depending on conditions of the heating or the cooling of each of the zones.

Assuming a state in the heating or the cooling of only a single zone, the state depends on a relationship among three temperatures of the heating (cooling) starting temperature y0, the temperature setpoint SV, and the equilibrium temperature Teq. For instance, when y0<Teq and SV<Teq, the heating reference model is employed when the maximum manipulated variable MVmax is outputted while the cooling

TABLE 1

| | SV | | | | | | | | | | |
|---|---|---|---|---|---|---|---|---|---|---|---|
| y0 | −10 | −5 | 0 | 5 | 10 | 15 | 20 | 25 | 30 | 35 | 40 |
| −15 | 15.2 | 32.2 | 51 | 72 | 95.9 | 123.5 | 156.4 | 196.9 | 249.7 | 325.6 | 462.9 |
| −10 | 0 | 16.7 | 35.6 | 56.6 | 80.4 | 108.1 | 141 | 181.5 | 234.3 | 310.2 | 447.4 |
| −5 | 0 | 0 | 18.7 | 39.7 | 63.5 | 91.2 | 124.1 | 164.6 | 217.4 | 293.3 | 430.5 |
| 0 | 0 | 0 | 0 | 21 | 44.8 | 72.5 | 105.4 | 145.9 | 198.7 | 274.6 | 411.8 |
| 5 | 0 | 0 | 0 | 0 | 23.9 | 51.5 | 84.4 | 124.9 | 177.7 | 253.7 | 390.9 |
| 10 | 0 | 0 | 0 | 0 | 0 | 27.7 | 60.6 | 101.1 | 153.9 | 229.9 | 367.1 |
| 15 | 0 | 0 | 0 | 0 | 0 | 0 | 33 | 73.5 | 126.3 | 202.3 | 339.5 |
| 20 | 0 | 0 | 0 | 0 | 0 | 0 | 0 | 40.8 | 93.6 | 169.6 | 306.8 |
| 25 | 0 | 0 | 0 | 0 | 0 | 0 | 0 | 0 | 53.3 | 129.3 | 266.5 |
| 30 | 0 | 0 | 0 | 0 | 0 | 0 | 0 | 0 | 0 | 76.8 | 214.1 |
| 35 | 0 | 0 | 0 | 0 | 0 | 0 | 0 | 0 | 0 | 0 | 138.9 | reference model is employed when the steady state manipulated variable MVss is outputted.

Moreover, since all the zones are possibly heated and cooled, the combinations of $2^3=8$ of the heating and the cooling are conceivable. For instance, given that the temperature setpoint of all the zone is changed from SV1=SV2=SV3=20 degrees C. to SV1=10 degrees C., SV2=30 degrees C. and SV3=50 degrees C., the zone 1 is to be cooled and the zones 2 and 3 are to be heated.

When the dead time is replaced with a first-order Padé approximation in the formula (27) in the same manner as in the formula (22), the formula (27) is represented by a formula (28)

$$G_{mc}(s) = \frac{-18.4\ s + 9.2}{142\ s^2 + 72\ s + 0.5} \tag{28}$$

When the formula (28) is further converted to a state equation of a discrete-time system (the sampling time: 0.1 second) in the same manner as the formulae (23) and (24), the formula (28) is represented by formulae (29) and (30).

$$\begin{bmatrix} x_{c1}(k+1) \\ x_{c2}(k+1) \end{bmatrix} = A_c \begin{bmatrix} x_{c1}(k) \\ x_{c2}(k) \end{bmatrix} + \tag{29}$$

$$B_c u(k) = \begin{bmatrix} 0.9505 & -0.005493 \\ 0.006094 & 1 \end{bmatrix} \begin{bmatrix} x_{c1}(k) \\ x_{c2}(k) \end{bmatrix} + \begin{bmatrix} 0.09751 \\ 0.0003073 \end{bmatrix} u(k)$$

$$y(k) = C_c \begin{bmatrix} x_{c1}(k) \\ x_{c2}(k) \end{bmatrix} = \begin{bmatrix} -0.1296 & 1.037 \end{bmatrix} \begin{bmatrix} x_{c1}(k) \\ x_{c2}(k) \end{bmatrix} \tag{30}$$

Next, a method of smoothly switching the state variables at the switching of the heating and the cooling when the output of the maximum manipulated variable MVmax is switched to the output of the steady state manipulated variable MVss during controlling will be described.

Sizes of matrixes are as follows according to the formulae (22), (23), (24), (28), (29) and (30).

Ah, Ac:2×2
Bh, Bc:2×1
Ch, Cc:1×2
xh, xc:2×1

Initial conditions are obtained according to a formula (31) below and represented by a formula (32) below.

$$\begin{bmatrix} y(0) \\ y(1) \end{bmatrix} = \begin{bmatrix} Cx(0) \\ Cx(1) \end{bmatrix} = \begin{bmatrix} Cx(0) \\ CAx(0) \end{bmatrix} = \begin{bmatrix} C \\ CA \end{bmatrix} x(0) \tag{31}$$

$$x(0) = \begin{bmatrix} C \\ CA \end{bmatrix}^{-1} \begin{bmatrix} y(0) \\ y(1) \end{bmatrix} \tag{32}$$

Accordingly, the initial conditions for heating are represented by a formula (33) and the initial conditions for cooling are represented by a formula (34).

$$\begin{bmatrix} x_{h1}(0) \\ x_{h2}(0) \end{bmatrix} = \begin{bmatrix} C_h \\ C_h A_h \end{bmatrix}^{-1} \begin{bmatrix} y(0) \\ y(1) \end{bmatrix} \tag{33}$$

$$\begin{bmatrix} x_{c1}(0) \\ x_{c2}(0) \end{bmatrix} = \begin{bmatrix} C_c \\ C_c A_c \end{bmatrix}^{-1} \begin{bmatrix} y(0) \\ y(1) \end{bmatrix} \tag{34}$$

Here, it is assumed to switch the state from the heating reference model to the cooling reference model. At the time of switching, since both of the reference models have the same input u(k) and output y(k), the following formulae (35) and (36) are established.

$$y(k) = C_h x_h(k) = C_c x_c(k) \tag{35}$$

$$y(k+1) = C_h x_h(k+1) = C_h A_h x_h(k) + C_h B_h u(k) = C_c A_c x_c(k) + C_c B_c u(k) \tag{36}$$

The formulae (35) and (36) are converted to a matrix to be represented by a formula (37).

$$\begin{bmatrix} y(k) \\ y(k+1) \end{bmatrix} = \begin{bmatrix} C_h \\ C_h A_h \end{bmatrix} x_h(k) + \begin{bmatrix} 0 \\ C_h B_h \end{bmatrix} u(k) = \tag{37}$$

$$\begin{bmatrix} C_c \\ C_c A_c \end{bmatrix} x_c(k) + \begin{bmatrix} 0 \\ C_c B_c \end{bmatrix} u(k)$$

From the above, when the heating reference model is switched to the cooling reference model, the following formula (38) is established.

$$\begin{bmatrix} C_c \\ C_c A_c \end{bmatrix} x_c(k) = \begin{bmatrix} C_h \\ C_h A_h \end{bmatrix} x_h(k) + \left( \begin{bmatrix} 0 \\ C_h B_h \end{bmatrix} - \begin{bmatrix} 0 \\ C_c B_c \end{bmatrix} \right) u(k) \tag{38}$$

$$x_c(k) = \begin{bmatrix} C_c \\ C_c A_c \end{bmatrix}^{-1} \left\{ \begin{bmatrix} C_h \\ C_h A_h \end{bmatrix} x_h(k) + \left( \begin{bmatrix} 0 \\ C_h B_h \end{bmatrix} - \begin{bmatrix} 0 \\ C_c B_c \end{bmatrix} \right) u(k) \right\}$$

Also when the cooling reference model is switched to the heating reference model, the following formula (39) is established.

$$x_h(k) = \begin{bmatrix} C_h \\ C_h A_h \end{bmatrix}^{-1} \left\{ \begin{bmatrix} C_c \\ C_c A_c \end{bmatrix} x_c(k) + \left( \begin{bmatrix} 0 \\ C_c B_c \end{bmatrix} - \begin{bmatrix} 0 \\ C_h B_h \end{bmatrix} \right) u(k) \right\} \tag{39}$$

The same idea is also employed in an optimal time search simulation for preparing the table of the switching time t1. For instance, when y0>SV>Teq, the cooling reference model is switched to the heating reference model at the time t1.

Figure 14:
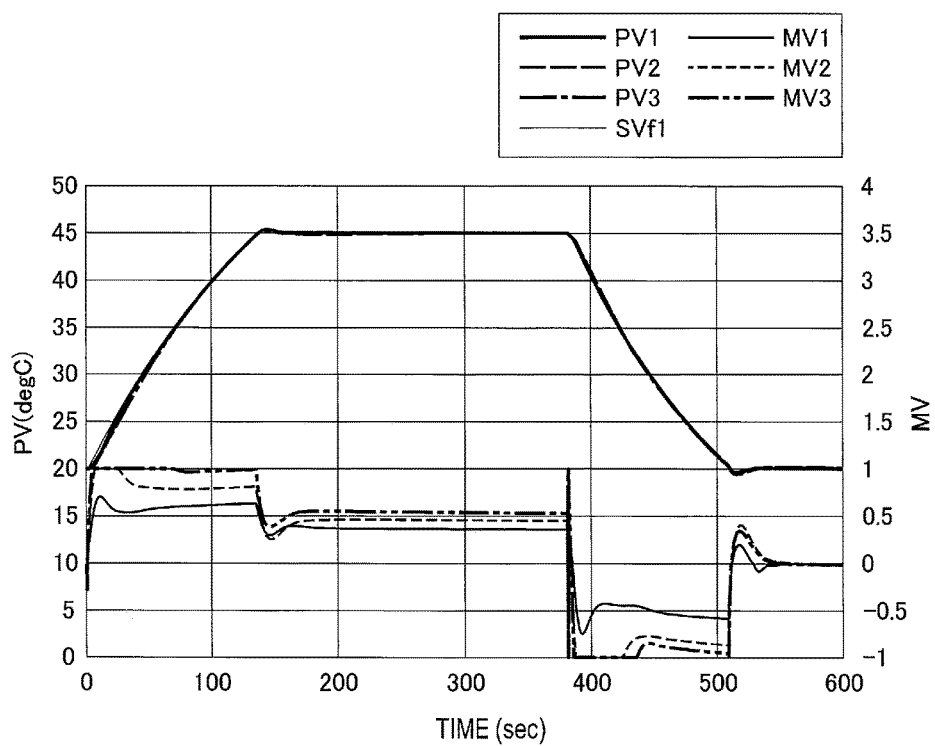
FIG. 14 is a graph showing simulation results in the exemplary embodiment.

Results of the above simulation are shown in FIG. 14. It is observed that the reference model output is suitably followed also in the cooling.

What is claimed is:

1. A temperature controller of a semiconductor wafer using a plurality of temperature adjusters usable for heating and cooling the semiconductor wafer, the temperature controller configured to control temperatures of the respective temperature adjusters to adjust temperatures of the semiconductor wafer, the temperature controller comprising:
   a plurality of control loops respectively set in the plurality of temperature adjusters;
   a plurality of temperature detectors provided to the respective control loops and configured to detect the temperatures of the semiconductor wafer adjusted by the respective temperature adjusters; and
   a manipulated variable calculator configured to calculate manipulated variables to be respectively given to the temperature adjusters of the control loops based on the temperatures detected by the temperature detectors, the manipulated variable calculator comprising:
a reference model generated based on a response in which, in the plurality of control loops, a manipulated variable of a first control loop having the slowest response speed is defined as 100% and the rest of the control loops is controlled to follow the first control loop;
an optimal manipulated variable pattern searching unit configured to search for, online or in advance offline using the reference model, an optimal manipulated variable pattern for reaching a temperature setpoint in the shortest time;
a reference model output generator configured to generate a reference model output to give to the reference model a manipulated variable of the optimal manipulated variable pattern searched by the optimal manipulated variable pattern searching unit;
a model following servo calculator configured to use the reference model output obtained by the reference model output generator; and
a reference model selecting unit configured to select one of a predetermined heating reference model and a predetermined cooling reference model depending on whether the temperature adjustment by the plurality of temperature adjusters is for heating or cooling, and to apply the selected heating or cooling reference model to the reference model,
wherein the reference model selecting unit is configured to select the reference model based on: a heating or cooling starting temperature when one or more of the manipulated variables are switched; the temperature setpoint; and an equilibrium temperature.

2. The temperature controller of the semiconductor wafer according to claim 1, further comprising:
a reference model cluster and an optimal control gain cluster of a number of combinations of heating and cooling in the plurality of control loops configured to heat or cool, wherein the reference model selecting unit selects the reference model from the reference model cluster to output the reference model to the reference model output generator and selects an optimal control gain from the optimal control gain cluster to output the optimal control gain to the model following servo calculator.

3. A temperature control method of a semiconductor wafer using a plurality of temperature adjusters usable for heating and cooling the semiconductor wafer, the temperature control method of controlling temperatures of the plurality of temperature adjusters using control loops respectively set in the temperature adjusters, the temperature control method comprising:
generating a reference model based on a response in which, in the control loops, a manipulated variable of a first control loop having the slowest response speed is defined as 100% and the rest of the control loops is controlled to follow the first control loop;
selecting a heating reference model or a cooling reference model depending on whether a to-be-controlled temperature adjuster of the plurality of temperature adjusters is to be heated or to be cooled, based on: a heating or cooling starting temperature when one or more of manipulated variables respectively given to the control loops are switched; a temperature setpoint; and an equilibrium temperature;
searching for, online or in advance offline using the reference model, an optimal manipulated variable pattern for reaching a temperature setpoint in the shortest time;
giving to the selected reference model a manipulated variable of the searched optimal manipulated variable pattern to generate a reference model output; and
using the generated reference model output to perform a model following servo control.

* * * * *